(12) United States Patent
Miyamoto et al.

(10) Patent No.: US 10,177,170 B2
(45) Date of Patent: Jan. 8, 2019

(54) DISPLAY DEVICE AND METHOD FOR MANUFACTURING SAME

(75) Inventors: Tadayoshi Miyamoto, Osaka (JP); Fumiki Nakano, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 14/128,437

(22) PCT Filed: Jun. 18, 2012

(86) PCT No.: PCT/JP2012/003960
§ 371 (c)(1),
(2), (4) Date: Dec. 20, 2013

(87) PCT Pub. No.: WO2012/176422
PCT Pub. Date: Dec. 27, 2012

(65) Prior Publication Data
US 2014/0131703 A1 May 15, 2014

(30) Foreign Application Priority Data
Jun. 24, 2011 (JP) .................................. 2011-140300

(51) Int. Cl.
*H01L 27/12* (2006.01)
*G02F 1/1368* (2006.01)

(52) U.S. Cl.
CPC ........ *H01L 27/1225* (2013.01); *H01L 27/127* (2013.01); *H01L 27/1251* (2013.01); *G02F 1/1368* (2013.01)

(58) Field of Classification Search
CPC ............... G02F 1/1368; H01L 27/1225; H01L 27/1251; H01L 27/127; H01L 27/3272;
(Continued)

(56) References Cited

U.S. PATENT DOCUMENTS 5,274,279 A * 12/1993 Misawa .............. G02F 1/13454
257/E23.016
2001/0052598 A1 12/2001 Koga et al.
(Continued)

FOREIGN PATENT DOCUMENTS

JP  11-84418 A   3/1999
JP  11-274512 A  10/1999
(Continued)

OTHER PUBLICATIONS

English translation of Official Communication issued in corresponding International Application PCT/JP2012/003960, dated Sep. 18, 2012.
(Continued)

*Primary Examiner* — Cuong Q Nguyen
(74) *Attorney, Agent, or Firm* — Keating & Bennett, LLP

(57) ABSTRACT

This display device is provided with: a circuit substrate having a display region and a non-display region; pixel-driving TFTs for driving pixels, formed in the display region and having source electrodes and drain electrodes being spaced apart from each other on an insulating film and a first active layer formed from an oxide semiconductor, provided on the opposite side from the insulating film so as to cover a separation section between a source electrode and a drain electrode and part of the source electrode and part of the drain electrode adjacent to the separation section; and a driver circuit TFT for driving the pixel-driving TFTs, formed in the non-display region and having a second active layer formed from a non-oxide semiconductor.

15 Claims, 8 Drawing Sheets

(58) Field of Classification Search
CPC ........... H01L 27/3244; H01L 29/78628; H01L 29/7869; H01L 29/78666; H01L 29/78675
See application file for complete search history.

(56) References Cited

U.S. PATENT DOCUMENTS

| | | |
|---|---|---|
| 2003/0141504 A1 | 7/2003 | Kuwabara et al. |
| 2006/0115944 A1* | 6/2006 | Kwak ................. H01L 21/8221 438/199 |
| 2007/0252145 A1* | 11/2007 | Toyota ................ H01L 29/4908 257/59 |
| 2007/0278490 A1* | 12/2007 | Hirao .................. H01L 29/7869 257/64 |
| 2007/0284627 A1* | 12/2007 | Kimura ............. G02F 1/134363 257/257 |
| 2008/0090344 A1 | 4/2008 | Kuwabara et al. |
| 2010/0117076 A1 | 5/2010 | Akimoto et al. |
| 2010/0176395 A1* | 7/2010 | Choi ....................... H01L 27/12 257/43 |
| 2010/0252833 A1* | 10/2010 | Liu ......................... H01L 27/12 257/59 |
| 2011/0128275 A1* | 6/2011 | Ueda .................... H01L 29/7869 345/212 |
| 2013/0214279 A1* | 8/2013 | Nishimura .......... G02F 1/13338 257/59 |

FOREIGN PATENT DOCUMENTS

| | | |
|---|---|---|
| JP | 2003-152191 A | 5/2003 |
| JP | 2007-298649 A | 11/2007 |
| JP | 2010-003910 A | 1/2010 |
| JP | 2010-045243 A | 2/2010 |
| JP | 2010-074148 A | 4/2010 |
| JP | 2010-135772 A | 6/2010 |

OTHER PUBLICATIONS

English translation of JP 2010-003910.

* cited by examiner

DISPLAY DEVICE AND METHOD FOR MANUFACTURING SAME

TECHNICAL FIELD

The present invention relates to a display device that includes thin film transistors having an oxide semiconductor layer, and a manufacturing method therefor.

BACKGROUND ART

In recent years, development has been progressing rapidly for flat panel display devices such as liquid crystal display devices and organic EL display devices. In order to increase display quality, such flat panel display devices often have an active matrix substrate upon which a thin film transistor (also referred to as a TFT below) is provided for each of a plurality of pixels for driving the pixels.

Display devices have the active matrix substrate and an opposite substrate disposed opposite to the active matrix substrate and bonded thereto through a frame-shaped sealing member. In the display device, a display region is formed on the inner side of the sealing member, whereas a non-display region is formed in the outer periphery of the display region.

Low temperature polysilicon (also referred to as LTPS below) that has been melt-crystallized by an excimer laser is suitably used in the TFTs formed for the respective pixels in the display region. TFTs having LTPS as the active layer have the advantage of a low threshold voltage and high-speed driving, and are widely used in high definition displays in devices such as mobile phones, smartphones, and tablet devices, for example. On the other hand, attempts have been made to form the semiconductor layer of the TFT of an oxide semiconductor layer such as IGZO (In—Ga—Zn—O). If forming TFTs of such an oxide semiconductor, it is possible to greatly reduce the off leakage current of the TFTs.

Also, in recent years, in the non-display region of the active matrix substrate, development has been progressing for increasing integration by directly forming driver circuits into a glass substrate included in the active matrix substrate. For example, Patent Document 1 discloses a configuration in which a display device has pixel-driving TFTs formed in the display region of the glass substrate and driver circuit TFTs formed in the non-display region of the glass substrate, and in which the active layer of the pixel-driving TFTs in this display device are made of an oxide semiconductor while the active layer of the driver circuit TFTs are made of low temperature polysilicon.

In the pixel-driving TFTs in Patent Document 1, the oxide semiconductor layer is formed on the surface of an insulating film, and an etching stopper layer is formed on the surface of the oxide semiconductor layer. A source electrode and a drain electrode are formed so as to cover portions of the etching stopper layer and portions of the oxide semiconductor layer. Therefore, when forming pixel-driving TFTs, a metal layer covering the oxide semiconductor layer and the etching stopper layer is etched, and by exposing the etching stopper layer, the source electrode and the drain electrode are formed of the remaining metal layer.

RELATED ART DOCUMENT

Patent Document

Patent Document 1: Japanese Patent Application Laid-Open Publication No. 2010-003910

SUMMARY OF THE INVENTION

Problems to be Solved by the Invention

However, in the display device of Patent Document 1, while the active layer of the driver circuit TFTs is made of low temperature polysilicon and the active layer of the pixel-driving TFTs is made of the oxide semiconductor, this requires the usage of a mask to form the etching stopper layer, which results in an increase in the number of masks needed to manufacture the display device, which increases manufacturing costs.

On the other hand, if an etching stopper layer is not provided, then when forming the source electrode and the drain electrode, heavy damage to the oxide semiconductor layer by etching is unavoidable, which makes it difficult to increase electrical characteristics of the TFTs.

The present invention takes into account these problems and an object thereof is to provide a display device including a substrate having formed thereon pixel-driving TFTs having active layers made of the oxide semiconductor and driver circuit TFTs having active layers made of a non-oxide semiconductor, in which it is possible to increase electrical characteristics of the TFTs as much as possible while lowering manufacturing costs.

Means for Solving the Problems

In order to attain the above-mentioned object, a display device according to the present invention includes: a circuit substrate having a display region having formed therein a plurality of pixels, and a non-display region provided outside a periphery of the display region; pixel-driving thin film transistors for driving the pixels, each of the pixel-driving thin film transistors having a source electrode and a drain electrode disposed apart from each other on an insulating film, and a first active layer made of an oxide semiconductor provided so as to cover a separation section between the source electrode and the drain electrode from a side thereof opposite to the insulating film and so as to cover a portion of the source electrode and a portion of the drain electrode that are respectively adjacent to the separation section; and a driver circuit thin film transistor for driving the pixel-driving thin film transistors, the driver circuit thin film transistor being formed in the non-display region of the circuit substrate and having a second active layer made of a non-oxide semiconductor.

Also, a method of manufacturing a display device according to the present invention is a method of manufacturing a display device including a circuit substrate having a display region having formed therein a plurality of pixels, and a non-display region provided outside a periphery of the display region, the method including: forming an insulating film in a region of the circuit substrate to be the display region; forming a source electrode and a drain electrode included in each of pixel-driving thin film transistors for driving the pixels such that the source electrode and the drain electrode are formed apart from each other on the insulating film; forming a first active layer included in each of the pixel-driving thin film transistors and made of an oxide semiconductor so as to cover a separation section between the source electrode and the drain electrode and so as to cover a portion of the source electrode and a portion of the drain electrode that are respectively adjacent to the separation section from a side thereof opposite to the insulating film; and forming a second active layer included in a driver circuit thin film transistor for driving the pixel-driving thin film transistors and made of a non-oxide semiconductor in a region to be the non-display region of the circuit substrate.

EFFECTS OF THE INVENTION

According to the present invention, the first active layer of the pixel-driving TFTs in the display region are made of an oxide semiconductor, and thus the off leakage current of the pixel-driving TFTs can be greatly reduced, which results in no longer needing to add additional circuit functions and being able to greatly increase the pixel aperture ratio. In addition, the second active layer of the driver circuit TFT in the non-display region is made of a non-oxide semiconductor, and thus, it is possible to make the driver circuit TFT of low temperature polysilicon or the like having a low threshold voltage, for example. Thus, the driver circuit TFT and the pixel-driving TFTs can be formed integrally with the circuit substrate and the off leakage current of the pixel-driving TFTs can be greatly reduced while increasing the reliability of the driver circuit TFTs. Furthermore, because respective portions of the source electrode and drain electrode of the pixel-driving TFTs are covered by the first active layer from the side thereof opposite to the insulating film on which the source electrode and drain electrode are disposed, and thus, there is no need to provide an etching stopper layer on the first active layer. Therefore, it is possible to reduce the number of masks needed during manufacturing and thereby lower the manufacturing cost while avoiding damage to the first active layer due to etching when forming the source electrodes and the like, and increasing the electrical characteristics of the pixel-driving TFTs.

DETAILED DESCRIPTION OF EMBODIMENTS

Embodiments of the present invention will be described in detail below with reference to drawings. The present invention is not limited to the embodiments below.

<<Embodiment 1>>

FIGS. 1 to 9 show Embodiment 1 of the present invention.

Figure 1:
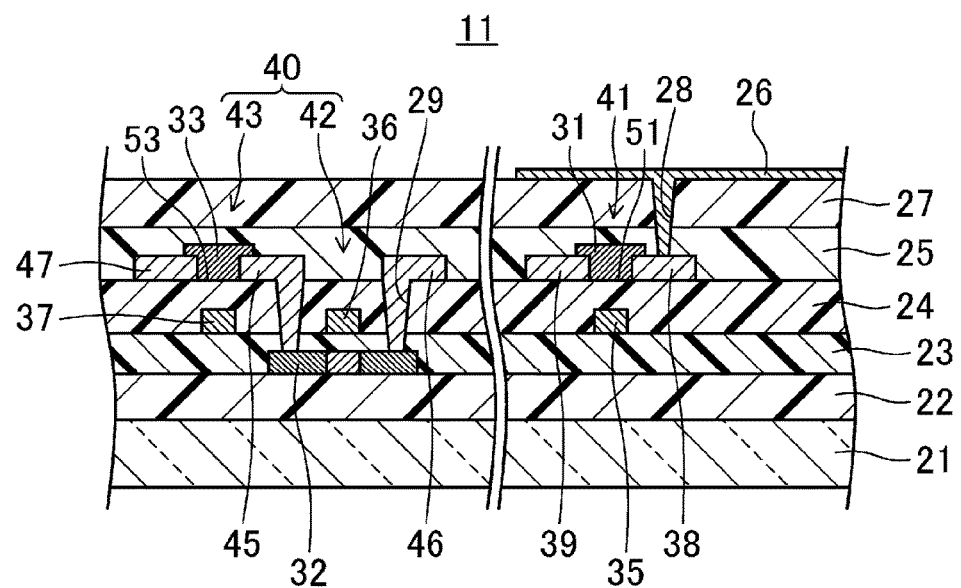
FIG. 1 is a cross-sectional view showing a structure of a TFT substrate of Embodiment 1.
Figure 2:
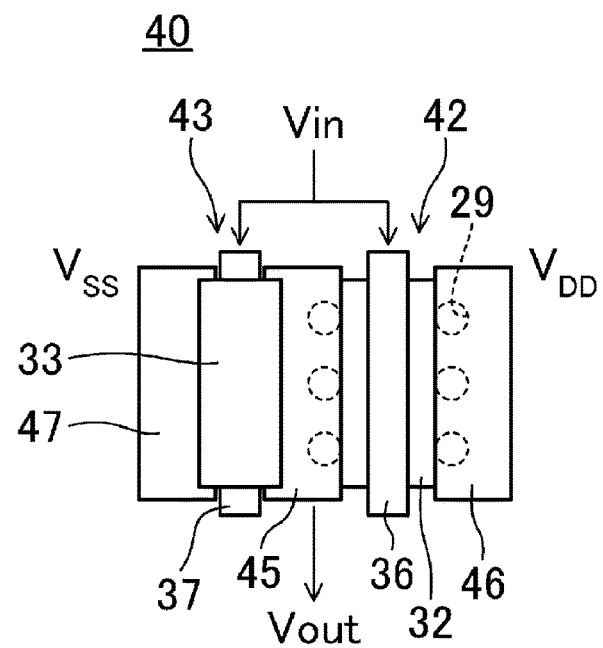
FIG. 2 is a plan view showing a CMOS inverter circuit of Embodiment 1.
Figure 3:
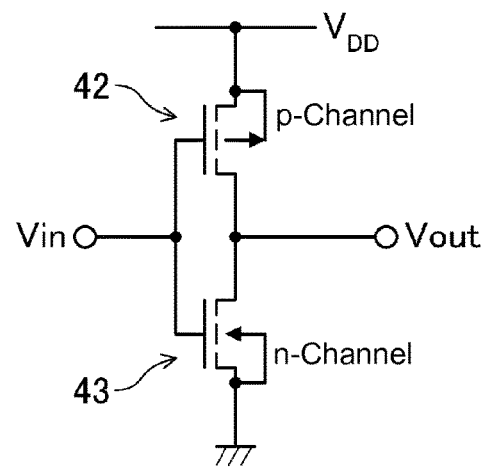
FIG. 3 is a circuit diagram showing a configuration of the CMOS inverter circuit.
Figure 4:
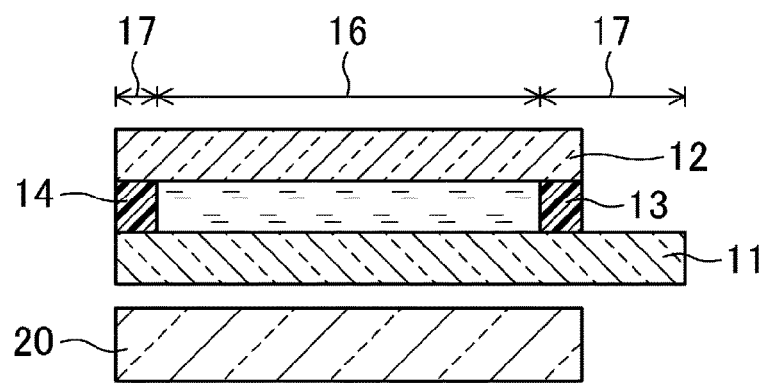
FIG. 4 is a cross-sectional view showing a schematic configuration of a liquid crystal display device.
Figure 5:
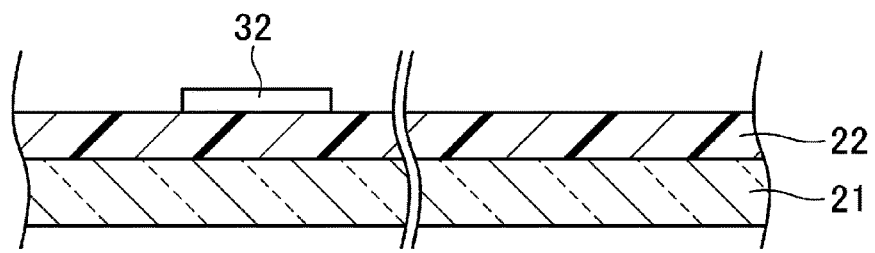
FIG. 5 is a cross-sectional view showing a glass substrate upon which a second active layer is formed.

FIG. 1 is a cross-sectional view showing a structure of a TFT substrate of Embodiment 1. FIG. 2 is a plan view showing a CMOS inverter circuit of Embodiment 1. FIG. 3 is a circuit diagram showing a configuration of the CMOS inverter circuit. FIG. 4 is a cross-sectional view showing a schematic configuration of a liquid crystal display device. FIG. 5 is a cross-sectional view showing a glass substrate upon which a second active layer is formed.

Figure 6:
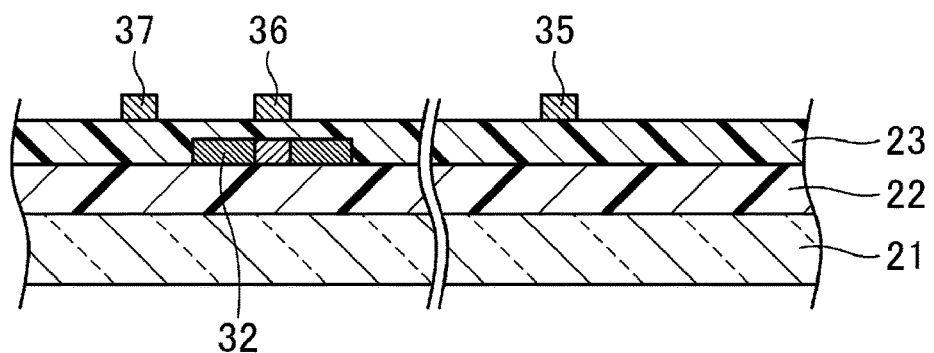
FIG. 6 is a cross-sectional view showing a glass substrate upon which a plurality of gate electrodes are formed.
Figure 7:
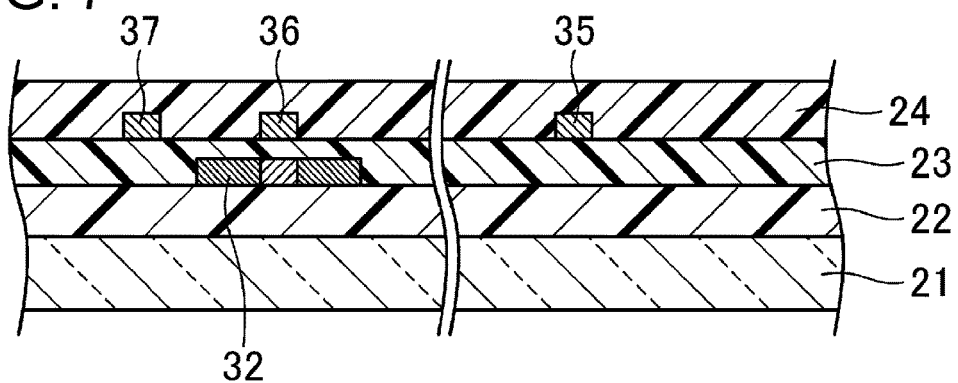
FIG. 7 is a cross-sectional view showing a glass substrate upon which interlayer insulating film is formed.
Figure 8:
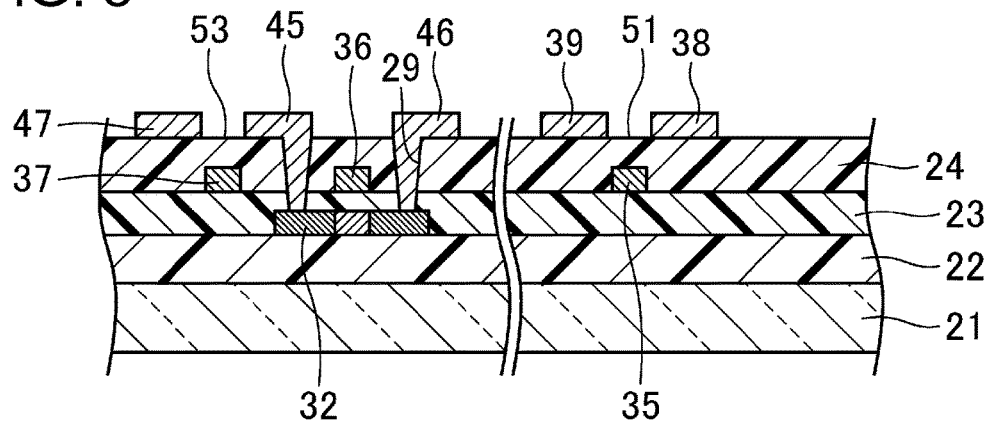
FIG. 8 is a cross-sectional view showing a glass substrate upon which a source electrode and a drain electrode are formed.
Figure 9:
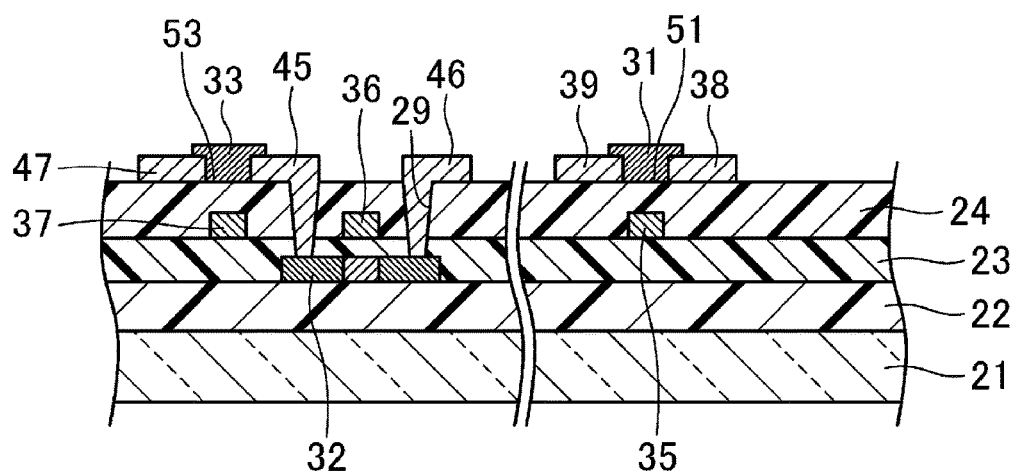
FIG. 9 is a cross-sectional view showing a glass substrate upon which a plurality of oxide semiconductor layers are formed.

FIG. 6 is a cross-sectional view showing a glass substrate upon which a plurality of gate electrodes are formed. FIG. 7 is a cross-sectional view showing a glass substrate upon which interlayer insulating film is formed. FIG. 8 is a cross-sectional view showing a glass substrate upon which a source electrode and a drain electrode are formed. FIG. 9 is a cross-sectional view showing a glass substrate upon which a plurality of oxide semiconductor layers are formed.

In the present embodiment, a liquid crystal display device 1 will be described as an example of the display device of the present invention. As shown in FIG. 4, the liquid crystal display device 1 includes a liquid crystal display panel 10 and a backlight unit 20, which is an illumination device disposed on the rear surface side of the liquid crystal display panel 10.

The liquid crystal display panel 10 has a TFT substrate 11 as an active matrix substrate, which is a circuit substrate, an opposite substrate 12 disposed so as to face the TFT substrate 11, and a liquid crystal layer 13 interposed between the TFT substrate 11 and the opposite substrate 12.

The liquid crystal display panel 10 and the TFT substrate 11 have a display region 16, and a frame-shaped non-display region 17 provided on the outer periphery of the display region 16. In the display region 16, a plurality of pixels (not shown in drawings) are arranged in a matrix. The pixels display any one of the three primary colors of red (R), green (G), and blue (B), for example, and color display of a chosen color is performed by a pixel unit constituted of a group of RGB pixels.

On the opposite substrate 12, respective color filters, a common electrode, and the like, which are not shown, are formed. The liquid crystal layer 13 is sealed in by the sealing member 14 provided between the TFT substrate 11 and the opposite substrate 12.

On the TFT substrate 11, a plurality of source wiring lines (not shown in drawings) extending in parallel with each other, and a plurality of gate wiring lines (not shown in drawings) extending while intersecting perpendicularly with the source wiring lines are formed. In other words, the group of wiring lines including the gate wiring lines and the source wiring lines are, as a whole, formed in a grid pattern. The pixels are formed in the grid region.

In the display region 16 of the TFT substrate 11, pixel-driving TFTs 41 for driving each of the pixels, and pixel electrodes 26 connected thereto are formed on the glass substrate 21. The pixel-driving TFTs 41 are connected to the respective source wiring lines and gate wiring lines. On the other hand, in the non-display region 17 of the TFT substrate 11, a driver circuit TFT 42 for driving the pixel-driving TFTs 41 is directly formed on the glass substrate 21.

The pixel-driving TFTs 41 are n-channel TFTs, and have a first active layer 31 made of an oxide semiconductor such as IGZO. On the other hand, the driver circuit TFT 42 is a p-channel TFT, and has a second active layer 32 made of a non-oxide semiconductor such as low temperature polysilicon (LTPS).

Also, in the non-display region 17 of the TFT substrate 11, a CMOS inverter circuit 40 as a CMOS circuit is formed directly on the glass substrate 21. The CMOS inverter circuit 40, as shown in FIGS. 1 to 3, has the p-channel TFT 42 that is the driver circuit TFT 42, and an n-channel TFT 43 that has a third active layer 33 made of an oxide semiconductor such as IGZO.

Here, the CMOS inverter circuit 40 is configured such that the same signal voltage Vin is simultaneously inputted to the gate electrode 36 of the p-channel TFT 42 and to the gate electrode 37 of the n-channel TFT 43. While the source electrode 46 of the p-channel TFT 42 is connected to a positive power source VDD, the source electrode 47 of the n-channel TFT 43 is electrically grounded. Also, the p-channel TFT 42 and the n-channel TFT 43 have a common drain electrode 45, and a signal voltage Vout is outputted from this drain electrode 45.

Next, the configuration of the TFT substrate 11 will be described in detail with reference to FIG. 1. The TFT substrate 11 has a glass substrate 21 as a transparent insulating substrate. On one surface of the glass substrate 21, a base coat layer 22 is formed. The base coat layer 22 is an insulating film having an $SiO_2$ film, an $SiN_x$ film, or a layered structure including an $SiO_2$ film and an $SiN_x$ film, for example.

On the surface of the base coat layer 22, the second active layer 32 made of low temperature polysilicon is formed in a prescribed shape in the non-display region 17. On the base coat layer 22, a gate insulating film 23 is formed so as to cover the second active layer 32. The gate insulating film 23 is made of an $SiO_2$ film or the like, for example.

On the surface of the gate insulating film 23, the gate electrodes 35, 36, and 37 included in the respective TFTs 41, 42, and 43 are formed. In other words, the pixel-driving TFTs 41 and the driver circuit TFT 42 respectively have the gate electrodes 35 and 36 formed in the same layer as each other. As shown in FIG. 2, the gate electrode 36 of the p-channel TFT 42 extends in parallel with the gate electrode 37 of the n-channel TFT 43. An interlayer insulating film 24 is formed on the gate insulating film 23 so as to cover the respective gate electrodes 35, 36, and 37.

On the surface of the interlayer insulating film 24, the source electrodes 39, 46, and 47, and the drain electrodes 38 and 45 are formed. The source electrode 46 and the drain electrode 45 are connected to the second active layer 32 through contact holes 29 formed in the interlayer insulating film 24 and the gate insulating film 23.

In other words, the pixel-driving TFTs 41 and the n-channel TFT 43 of the CMOS inverter circuit 40 have source electrodes 39 and 47 and drain electrodes 38 and 45 disposed apart from each other on the interlayer insulating film 24. On the interlayer insulating film 24, a separation section 51 is formed between the source electrode 39 and the drain electrode 38, and a separation section 53 is formed between the source electrode 47 and the drain electrode 45.

The first active layer 31 made of the oxide semiconductor is provided so as to cover the separation section 51, and a portion of the source electrode 39 and a portion of the drain electrode 38 adjacent to the separation section 51, from the side opposite to the interlayer insulating film 24. Similarly, the third active layer 33 made of the oxide semiconductor is provided so as to cover the separation section 53, and a portion of the source electrode 47 and a portion of the drain electrode 45 adjacent to the separation section 53, from the side opposite to the interlayer insulating film 24.

In this manner, the n-channel TFT 43 of the CMOS inverter circuit 40 has the source electrode 47, the drain electrode 45, and the third active layer 33 in the same positional relation as the source electrode 39, the drain electrode 38, and the first active layer 31 in the pixel-driving TFT 41.

In the present embodiment, as shown in FIGS. 1 and 2, the second active layer 32 of the p-channel TFT 42 and the third active layer 33 of the n-channel TFT 43 in the CMOS inverter circuit 40 are disposed so as not to overlap each other when viewed from the direction normal to the surface of the TFT substrate 11.

On the surface of the interlayer insulating film 24, a passivation film 25 is formed so as to cover the first active layer 31, the third active layer 33, the source electrodes 39, 46, and 47, and the drain electrodes 38 and 45. Furthermore, a planarizing film 27 is formed on the surface of the passivation film 25. The planarizing film 27 is made of a photosensitive insulating film. On the surface of the planarizing film 27, pixel electrodes 26 made of a transparent conductive film such as ITO, for example, are formed. The pixel electrodes 26 are connected to the drain electrodes 38 of the pixel-driving TFTs 41 through contact holes 28 formed in the planarizing film 27 and the passivation film 25.

—Manufacturing Method—

Next, a manufacturing method for the liquid crystal display device 1 will be described with reference to FIGS. 1 and 5 to 9. First, as shown in FIG. 5, an amorphous silicon (also referred to as a-Si below) film, for example, is formed to a thickness of approximately 50 nm, for example, by PCVD (plasma chemical vapor deposition) or the like onto the surface of the base coat layer 22 formed on the glass substrate 21.

Next, the a-Si film is crystallized by being irradiated with an excimer laser, thus forming a polysilicon (poly-Si) film (excimer laser annealing method). Next, a resist layer is formed on the polysilicon film, and using this resist layer as a patterning mask, the polysilicon film is etched, thus forming an island-shaped semiconductor layer 32 in the non-display region 17.

Next, as shown in FIG. 6, the gate insulating film 23 is formed so as to cover the semiconductor layer 32. The gate insulating film 23 is made of an $SiO_2$ film with a thickness of 50 nm to 100 nm, for example. Then, as necessary, an impurity is implanted in the entire semiconductor layer 32.

Next, the gate electrodes 35, 36, and 37 are formed on the surface of the gate insulating film 23. The gate electrodes 35, 36, and 37 are made by patterning, by photolithography or the like, a conductive film deposited onto the surface of the gate insulating film 23, by sputtering, CVD, or the like, into a prescribed shape. At this time, the gate electrode 36 is formed so as to cover the region of the semiconductor layer 32 to be the channel region.

In this manner, the gate electrode 35 of the pixel-driving TFT 41, the gate electrode 36 of the p-channel TFT 42, which is the driver circuit TFT 42, and the gate electrode 37 of the n-channel TFT 43 are formed in the same layer. The gate electrode 36 of the p-channel TFT 42 is formed so as to extend in parallel with the gate electrode 37 of the n-channel TFT 43. Here, the p-channel TFT 42 and the n-channel TFT 43 constitute the CMOS inverter circuit 40.

Then, using the gate electrode 36 as a mask, impurity ions such as boron ions, for example, are implanted in the semiconductor layer 32, and activation is performed by adding heat. By forming a source region and a drain region with a lowered resistance in the semiconductor layer 32, the second active layer 32 constituting the p-channel TFT 42 and made of a non-oxide semiconductor is formed in a region of the TFT substrate 11 to be the non-display region 17.

Next, as shown in FIG. 7, the interlayer insulating film 24 is formed over the entire glass substrate 21 (in other words, the region of the TFT substrate 11 to be the display region 16 and the region to be the non-display region 17) so as to cover the gate insulating film 23 and the gate electrodes 35, 36, and 37.

Next, as shown in FIG. 8, contact holes 29 are formed in the interlayer insulating film 24 and the gate insulating film 23 over the second active layer 32. Then, by patterning the conductive film formed on the interlayer insulating film 24 by photolithography or the like, the source electrodes 39, 46, and 47 and the drain electrodes 38 and 45 are formed. The source electrode 46 and the drain electrode 45 are respectively connected to the second active layer 32 through the contact holes 29. At this time, the source electrode 39 and the drain electrode 38 included in the pixel-driving TFTs 41 are formed on the interlayer insulating film 24 separate from each other. Also, the source electrode 47 and the drain electrode 45 of the n-channel TFT 43 are formed on the interlayer insulating film 24 separate from each other.

Next, an oxide semiconductor film is formed to a thickness of approximately 30 nm to 100 nm by sputtering, for example, so as to directly cover the source electrodes 39, 46, and 47 and the drain electrodes 38 and 45. Next, this oxide semiconductor film is etched using photolithography and a resist mask, and thus, as shown in FIG. 9, a separation section 51 and an island-shaped first active layer 31 are formed, the first active layer 31 covering a portion of the source electrode 39 and a portion of the drain electrode 38 adjacent to the separation section 51 on the side thereof opposite to the interlayer insulating film 24. Also, a separation section 53 and an island-shaped third active layer 33 are formed, the third active layer 33 covering a portion of the source electrode 47 and a portion of the drain electrode 45 adjacent to the separation section 53 on the side thereof opposite to the interlayer insulating film 24.

In other words, the third active layer 33 is made of the same oxide semiconductor as the first active layer 31. Also, the first active layers 31 are formed in a region of the TFT substrate 11 to be the display region 16. On the other hand, the third active layer 33 is formed in a region of the TFT substrate 11 to be the non-display region 17. In this step, the third active layer 33 is formed so as not to overlap the second active layer 32 when viewed from the direction normal to the surface of the TFT substrate 11.

In this manner, it is possible to form on the same glass substrate 21 the p-channel TFT (driver circuit TFT) 42 in which the second active layer 32 made of the low temperature polysilicon is disposed on the glass substrate 21 side of the gate electrode 36, and the pixel-driving TFT 41 and the n-channel TFT 43 in which the first active layer 31 or the third active layer 33 made of the oxide semiconductor is disposed on the side of the gate electrodes 35 and 37 opposite to the glass substrate 21.

Next, the passivation film 25 is formed so as to cover the first active layer 31 and the third active layer 33, and then, the planarizing film 27 is formed on the surface of the passivation film 25. Then, a contact hole 28 is formed through the passivation film 25 and the planarizing film 27 over the drain electrode 38 in the pixel driving TFT 41. Next, the pixel electrodes 26 are formed by patterning the transparent conductive film such as ITO deposited on the surface of the planarizing film 27 into a prescribed shape by photolithography.

Then, an alignment film (not shown) is formed so as to cover the pixel electrodes 26, and the TFT substrate 11 is completed. By bonding together the TFT substrate 11 and the opposite substrate 12 formed separately with the liquid crystal layer 13 and the frame-shaped sealing member 14 therebetween, the liquid crystal display panel 10 is completed. Then, a backlight unit 20 is disposed facing the liquid crystal display panel 10 on the side of the TFT substrate 11, thus completing the liquid crystal display device 1.

—Effects of Embodiment 1—

Therefore, according to Embodiment 1, the first active layer 31 of the pixel-driving TFTs 41 in the display region 16 is made of an oxide semiconductor such as IGZO, and thus, it is possible to greatly reduce the off leakage current in the pixel-driving TFTs 41, and thus, there is no need to add additional circuit functions and it is possible to greatly increase the aperture ratio. Also, in the non-display region 17, the driver circuit TFT (n-channel TFT) 42 has the second active layer 32 made of low temperature polysilicon, which is a non-oxide semiconductor, and thus, it is possible to perform high-speed driving while lowering the threshold voltage. Thus, the CMOS inverter circuit 40, which is a peripheral circuit, and pixel-driving TFTs 41 are formed integrally on the glass substrate 21, and it is possible to greatly reduce off leakage current in the pixel-driving TFTs 41 while improving the reliability of the driver circuit TFTs 42.

Furthermore, respective portions of the source electrode 39 and the drain electrode 38 of the pixel-driving TFT 41 are covered by the first active layer 31 from the side thereof opposite to the interlayer insulating film 24 on which the source electrode 39 and the drain electrode 38 are disposed, and thus, there is no need to form an etching stopper layer on the first active layer 31. Similarly, respective portions of the source electrode 47 and the drain electrode 45 of the n-channel TFT 43 of the CMOS inverter circuit 40 are covered by the third active layer 33 from the side thereof opposite to the interlayer insulating film 24, and thus, there is no need to provide an etching stopper layer on the third active layer 33 either. Thus, it is possible to reduce the number of masks needed during manufacturing and thereby reduce the manufacturing cost, while avoiding damage caused by etching to the first active layer 31 and the third active layer 33 when forming the source electrodes 39, 47, and the like, and increasing the electrical characteristics of the pixel-driving TFTs 41 and the n-channel TFT 43.

Also, it is possible to configure the CMOS inverter circuit 40 of the n-channel TFT 43 having the third active layer 33 formed at the same time and of the same oxide semiconductor as the first active layer 31 of the pixel-driving TFT 41, and the p-channel TFT 42 having the second active layer 32 made of low temperature polysilicon.

Here, if the n-channel TFT included in the CMOS inverter circuit 40 had the active layer thereof made of low temperature polysilicon as in conventional configurations, then there would be a need for an LDD (lightly doped drain) structure in order to perform high-speed operations, which would increase the number of manufacturing steps. By contrast, in the present embodiment, the n-channel TFT 43 included in the CMOS inverter circuit 40 has the third active layer 33 made of the oxide semiconductor, and thus, it is possible to have high-speed operations while reducing the number of manufacturing steps for the CMOS inverter circuit 40.

Also, in conventionally known CMOS inverter circuits, the n-channel TFT and the p-channel TFT thereof have active layers respectively made of a non-oxide semiconductor such as low temperature polysilicon (LTPS). The respective active layers are disposed adjacent to each other in the same layer. In the present embodiment, in the CMOS inverter circuit 40, the third active layer 33 of the n-channel TFT 43 is disposed so as not to overlap the second active layer 32 of the p-channel TFT 42 when viewed from the direction normal to the surface of the TFT substrate 11, and it is possible to form the CMOS invert circuit 40 with approximately the same area as a CMOS inverter circuit having an n-channel TFT and a p-channel TFT respectively having conventional active layers made of LTPS.

<<Embodiment 2>>

FIGS. 10 to 13 show Embodiment 2 of the present invention.

Figure 10:
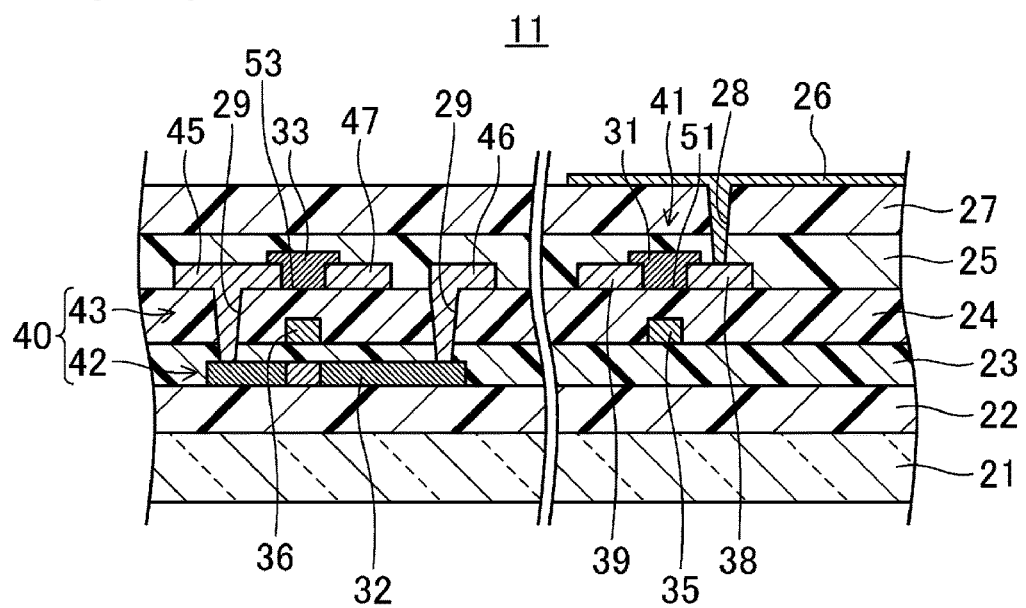
FIG. 10 is a cross-sectional view showing a structure of a TFT substrate of Embodiment 2.
Figure 11:
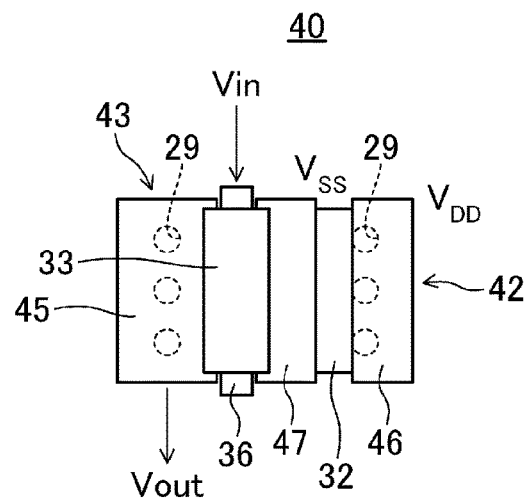
FIG. 11 is a plan view showing a CMOS inverter circuit of Embodiment 2.
Figure 12:
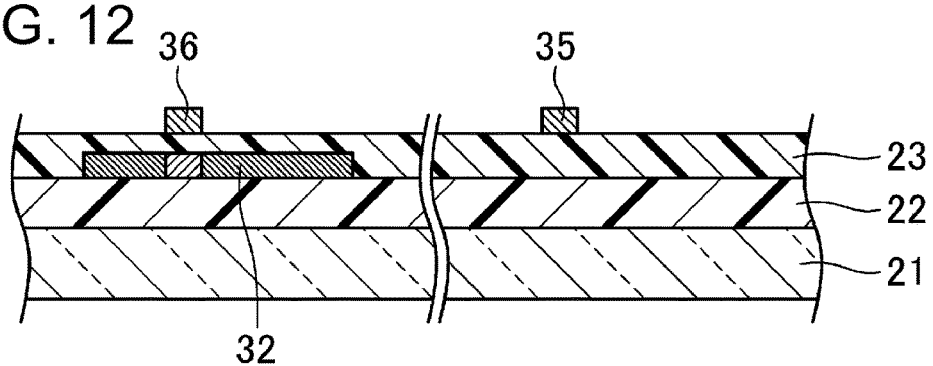
FIG. 12 is a cross-sectional view showing a glass substrate upon which a plurality of gate electrodes are formed.
Figure 13:
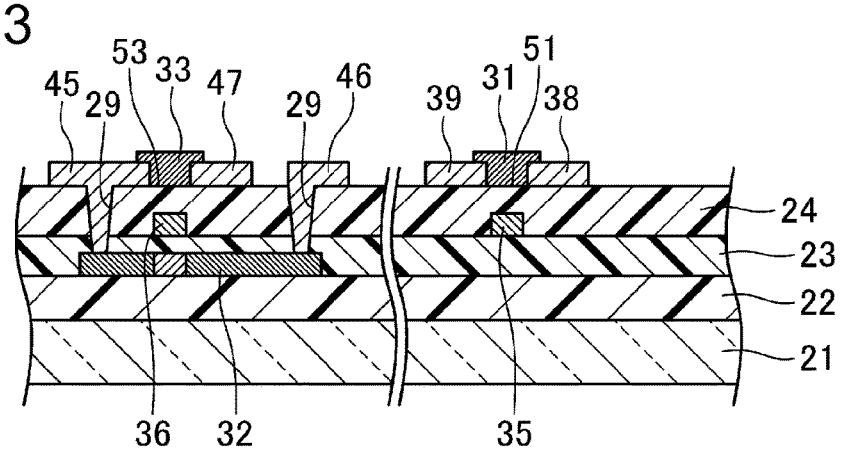
FIG. 13 is a cross-sectional view showing a glass substrate upon which a plurality of oxide semiconductor layers are formed.

FIG. 10 is a cross-sectional view showing a structure of a TFT substrate of Embodiment 2. FIG. 11 is a plan view showing a CMOS inverter circuit of Embodiment 2. FIG. 12 is a cross-sectional view showing a glass substrate upon which a plurality of gate electrodes are formed. FIG. 13 is a cross-sectional view showing a glass substrate upon which a plurality of oxide semiconductor layers are formed.

In each embodiment below, parts that are the same as FIGS. 1 to 9 are assigned the same reference characters and detailed descriptions thereof will be omitted.

Embodiment 2 is a modification of the configuration of the CMOS inverter circuit 40 of Embodiment 1. In other words, whereas in Embodiment 1, the third active layer 33 of the n-channel TFT 43 does not overlap the second active layer 32 of the p-channel TFT 42 when viewed from the direction normal to the surface of the TFT substrate 11, in Embodiment 2, as shown in FIG. 10, a third active layer 33 overlaps a second active layer 32 when viewed from the direction normal to the surface of a TFT substrate 11. A p-channel TFT 42 and an n-channel TFT 43 have a common gate electrode 36.

In other words, similar to Embodiment 1, the TFT substrate 11 has a glass substrate 21 as a transparent insulating substrate. On one surface of the glass substrate 21, a base coat layer 22 is formed. On the surface of the base coat layer 22, the second active layer 32 made of low temperature polysilicon is formed in a prescribed shape in the non-display region 17. On the base coat layer 22, a gate insulating film 23 is formed so as to cover the second active layer 32. The gate insulating film 23 is made of an $SiO_2$ film or the like, for example.

On the surface of the gate insulating film 23, the gate electrodes 35 and 36 included in the respective TFTs 41, 42, and 43 are formed. In other words, the pixel-driving TFTs 41 and the driver circuit TFT 42 respectively have the gate electrodes 35 and 36 formed in the same layer as each other. As shown in FIGS. 10 and 11, the gate electrode 36 of the p-channel TFT 42 is the same as the gate electrode 36 as the n-channel TFT 43. An interlayer insulating film 24 is formed on the gate insulating film 23 so as to cover the respective gate electrodes 35 and 36.

On the surface of the interlayer insulating film 24, the source electrodes 38, 46, and 47, and the drain electrodes 38 and 45 are formed. The source electrode 46 and the drain electrode 45 are connected to the second active layer 32 through contact holes 29 formed in the interlayer insulating film 24 and the gate insulating film 23.

In other words, the pixel-driving TFTs 41 and the n-channel TFT 43 of the CMOS inverter circuit 40 have source electrodes 39 and 47 and drain electrodes 38 and 45 disposed apart from each other on the interlayer insulating film 24. On the interlayer insulating film 24, a separation section 51 is formed between the source electrode 39 and the drain electrode 38, and a separation section 53 is formed between the source electrode 47 and the drain electrode 45.

The first active layer 31 made of the oxide semiconductor is provided so as to cover the separation section 51, and a portion of the source electrode 39 and a portion of the drain electrode 38 adjacent to the separation section 51, from the side opposite to the interlayer insulating film 24. Similarly, the third active layer 33 made of the oxide semiconductor is provided so as to cover the separation section 53, and a portion of the source electrode 47 and a portion of the drain electrode 45 adjacent to the separation section 53, from the side opposite to the interlayer insulating film 24.

On the surface of the interlayer insulating film 24, a passivation film 25 is formed so as to cover the first active layer 31, the third active layer 33, the source electrodes 39, 46, and 47, and the drain electrodes 38 and 45. Furthermore, a planarizing film 27 is formed on the surface of the passivation film 25. On the surface of the planarizing film 27, pixel electrodes 26 made of a transparent conductive film such as ITO, for example, are formed. The pixel electrodes 26 are connected to the drain electrodes 38 of the pixel-driving TFTs 41 through contact holes 28 formed in the planarizing film 27 and the passivation film 25.

—Manufacturing Method—

When manufacturing the liquid crystal display device 1, first, as shown in FIG. 12, an a-Si film, for example, is formed by PCVD or the like to a thickness of approximately 50 nm, for example, on the surface of the base coat layer 22 formed on the glass substrate 21. Next, by excimer laser annealing, a polysilicon film is formed from the a-Si film. Next, by etching the polysilicon film, an island-shaped semiconductor layer 32 is formed in the non-display region 17.

Next, the gate insulating film 23 is formed so as to cover the semiconductor layer 32. The gate insulating film 23 is made of an SiO2 film with a thickness of 50 nm to 100 nm, for example. Then, as necessary, an impurity is implanted in the entire semiconductor layer 32. Next, the gate electrodes 35 and 36 are made by patterning by photolithography or the like a conductive film deposited onto the surface of the gate insulating film 23 by sputtering, CVD, or the like into a prescribed shape. The gate electrode 36 is a gate electrode common to the p-channel TFT 42 and the n-channel TFT 43. Then, using the gate electrode 36 as a mask, impurity ions such as boron ions, for example, are implanted in the semiconductor layer 32, and activation is performed by adding heat, thus forming the second active layer 32.

Next, as shown in FIG. 13, the interlayer insulating film 24 is formed on the entire glass substrate 21 so as to cover the gate insulating film 23 and the gate electrodes 35 and 36. Next, contact holes 29 are formed in the interlayer insulating film 24 and the gate insulating film 23 over the second active layer 32. Then, by patterning the conductive film formed on the interlayer insulating film 24 by photolithography or the like, the source electrodes 39, 46, and 47 and the drain electrodes 38 and 45 are formed.

At this time, a portion of the source electrode 47 and a portion of the drain electrode 45 of the n-channel TFT 43 overlap the second active layer 32. In this manner, the source electrode 46 and the drain electrode 45 are respectively connected to the second active layer 32 through the contact holes 29.

Next, an oxide semiconductor film is formed by sputtering to a thickness of approximately 30 nm to 100 nm, for example so as to directly cover the source electrodes 39, 46, and 47 and the drain electrodes 38 and 45. Next, by etching the oxide semiconductor film by etching using photolithography and a resist mask, as shown in FIG. 13, the island-shaped first active layer 31 and third active layer 33 respectively covering separation sections 51 and 53 are formed. At this time, the third active layer 33 is formed so as to overlap the second active layer 32 when viewing the surface of the TFT substrate 11 from the normal direction.

Next, the passivation film 25 is formed so as to cover the first active layer 31 and the third active layer 33, and next, a planarizing film 27 is formed on the surface of the passivation film 25. Then, a contact hole 28 is formed in the passivation film 25 and the planarizing film 27 over the drain electrode 38 in the pixel-driving TFT 41. Next, the pixel electrodes 26 are formed by patterning by photolithography a transparent conductive film such as ITO deposited on the surface of the planarizing film 27 into a prescribed shape. In this manner, the TFT substrate 11 is manufactured.

—Effects of Embodiment 2—

Therefore, according to Embodiment 2 also, as in Embodiment 1, the first active layer 31 is made of an oxide semiconductor such as IGZO, and thus, the off leakage current in the pixel-driving TFTs 41 can be greatly reduced, and the aperture ratio can be greatly increased. Also, the driver circuit TFT (n-channel TFT) 42 has the second active layer 32 made of low temperature polysilicon, and thus, it is possible to perform high-speed driving while lowering the threshold voltage. Thus, the CMOS inverter circuit 40, which is a peripheral circuit, and pixel-driving TFTs 41 are formed integrally on the glass substrate 21, and it is possible to greatly reduce off leakage current in the pixel-driving TFTs 41 while improving the reliability of the driver circuit TFTs 42.

Furthermore, respective portions of the source electrode 39 and the drain electrode 38 of the pixel-driving TFT 41 are covered by the first active layer 31 from the side thereof opposite to the interlayer insulating film 24 on which the source electrode 39 and the drain electrode 38 are disposed, and respective portions of the source electrode 47 and the drain electrode 45 of the n-channel TFT 43 of the CMOS inverter circuit 40 are covered by the third active layer 33 from the side thereof opposite to the interlayer insulating film 24. Thus, there is no need to form an etching stopper layer respectively on the first active layer 31 and the third active layer 33. Thus, it is possible to prevent damage to the first active layer 31 and the third active layer 33 resulting from etching when forming the source electrodes 39 and 47, and it is possible to increase electrical characteristics of the pixel-driving TFTs 41 and the n-channel TFT 43, while reducing the number of masks needed during manufacturing and thereby reducing manufacturing cost.

Additionally, in the n-channel TFT 43 included in the CMOS inverter circuit 40, the third active layer 33 is made of the oxide semiconductor, and thus, compared to a conventional configuration having an LDD structure low temperature polysilicon active layer, it is possible to increase the operation speed while reducing the number of manufacturing steps for the CMOS inverter circuit 40.

Also, in the present embodiment, in the CMOS inverter circuit 40, the third active layer 33 of the n-channel TFT 43 overlaps the second active layer 32 of the p-channel TFT 42 when viewed from the direction normal to the surface of the TFT substrate 11, and thus, it is possible to shrink the area thereof and thereby miniaturize the CMOS inverter circuit 40.

<<Embodiment 3>>

FIGS. 14 to 18 show Embodiment 3 of the present invention.

Figure 14:
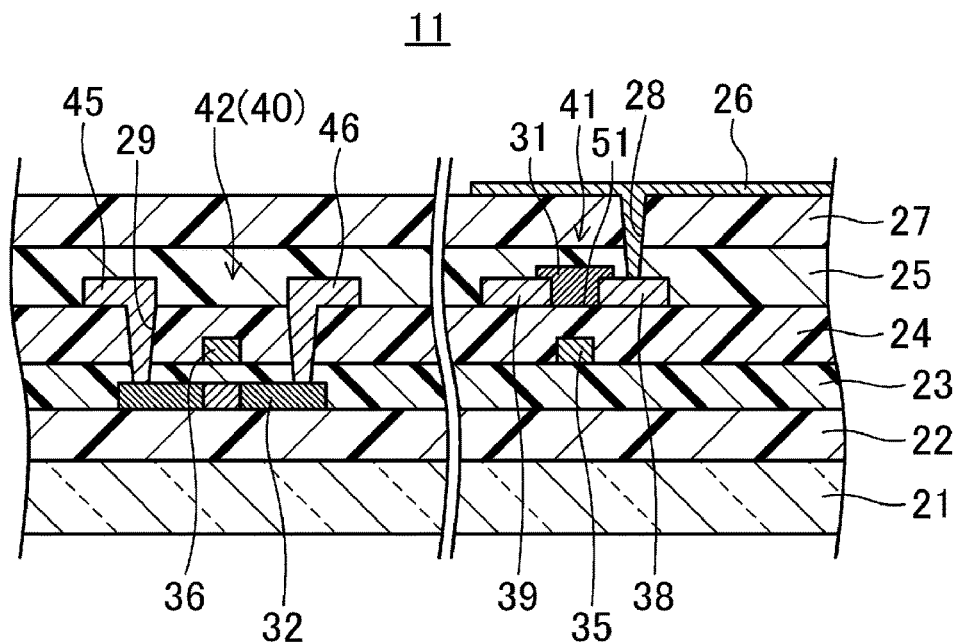
FIG. 14 is a cross-sectional view showing a structure of a TFT substrate of Embodiment 3.
Figure 15:
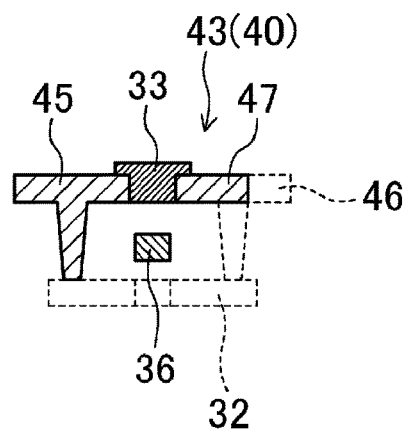
FIG. 15 is a cross-sectional view showing a schematic configuration along the line XV-XV in FIG. 16.
Figure 16:
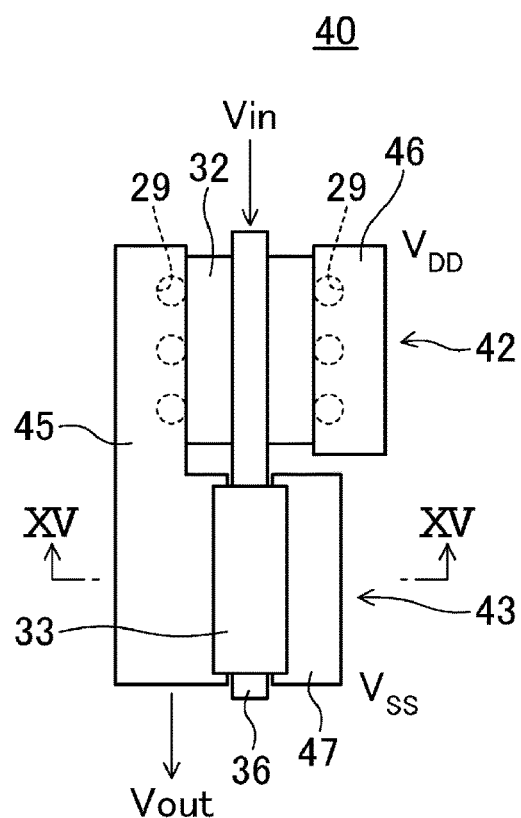
FIG. 16 is a plan view showing a CMOS inverter circuit of Embodiment 3.
Figure 17:
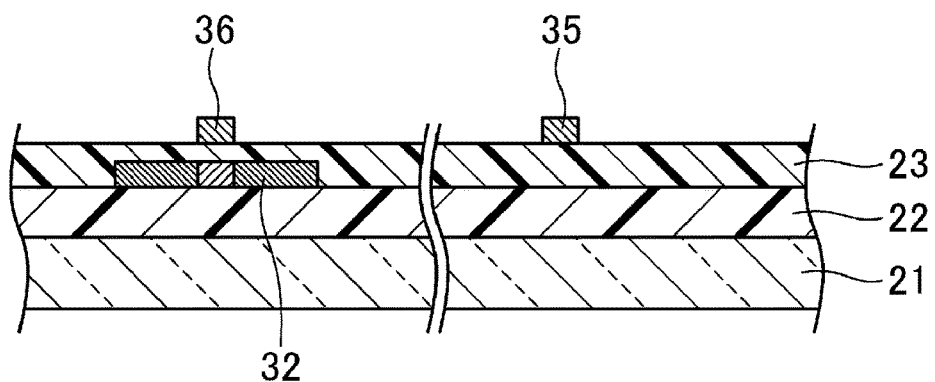
FIG. 17 is a cross-sectional view showing a glass substrate upon which a plurality of gate electrodes are formed.
Figure 18:
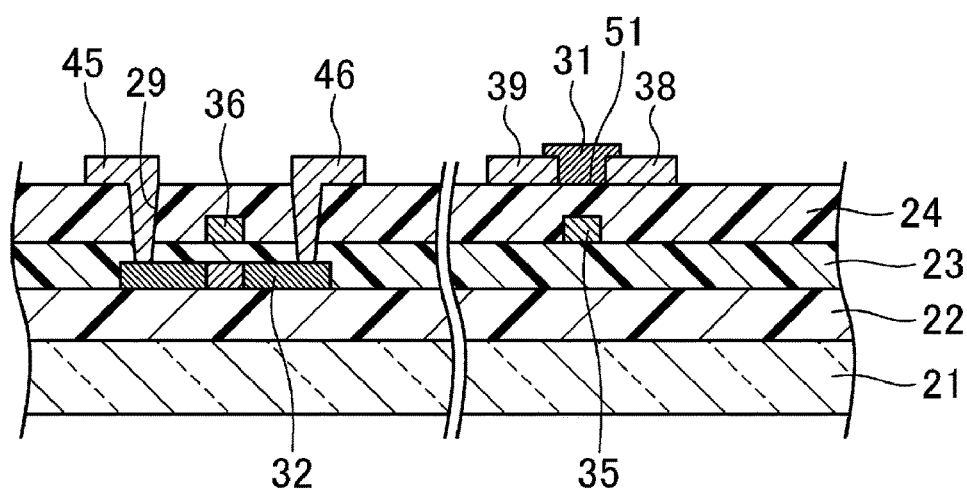
FIG. 18 is a cross-sectional view showing a glass substrate upon which a plurality of oxide semiconductor layers are formed.

FIG. 14 is a cross-sectional view showing a structure of a TFT substrate of Embodiment 3. FIG. 15 is a cross-sectional view along the line XV-XV in FIG. 16. FIG. 16 is a plan view showing a CMOS inverter circuit of Embodiment 3. FIG. 17 is a cross-sectional view showing a glass substrate upon which a plurality of gate electrodes are formed. FIG. 18 is a cross-sectional view showing a glass substrate upon which a plurality of oxide semiconductor layers are formed.

Embodiment 3 is a modification of the configuration of the CMOS inverter circuit 40 of Embodiment 1. In other words, Embodiment 3 is similar to Embodiment 1 in that the third active layer 33 of the n-channel TFT 43 does not overlap the second active layer 32 of the p-channel TFT 42 when viewed from the direction normal to the surface of the TFT substrate 11.

However, whereas in Embodiment 1, the gate electrodes 36 and 37 of the CMOS inverter circuit 40 extend in parallel with each other, in Embodiment 3, the gate electrode 36 of the p-channel TFT 42 and the gate electrode 36 of the n-channel TFT 43 are connected to each other and extend in a line-shape.

In other words, similar to Embodiment 1, the TFT substrate 11 has a glass substrate 21 as a transparent insulating substrate. On one surface of the glass substrate 21, a base coat layer 22 is formed. On the surface of the base coat layer 22, the second active layer 32 made of low temperature polysilicon is formed in a prescribed shape in the non-display region 17. On the base coat layer 22, a gate insulating film 23 is formed so as to cover the second active layer 32. The gate insulating film 23 is made of an $SiO_2$ film or the like, for example.

On the surface of the gate insulating film 23, the gate electrodes 35 and 36 included in the respective TFTs 41, 42, and 43 are formed. In other words, the pixel-driving TFTs 41 and the driver circuit TFT 42 respectively have the gate electrodes 35 and 36 formed in the same layer as each other. As shown in FIGS. 14 to 16, the gate electrode 36 of the p-channel TFT 42 has the same gate electrode 36 as the n-channel TFT 43. An interlayer insulating film 24 is formed on the gate insulating film 23 so as to cover the respective gate electrodes 35 and 36.

On the surface of the interlayer insulating film 24, the source electrodes 38, 46, and 47, and the drain electrodes 38 and 45 are formed. The source electrode 46 and the drain electrode 45 are connected to the second active layer 32 through contact holes 29 formed in the interlayer insulating film 24 and the gate insulating film 23.

In other words, the pixel-driving TFTs 41 and the n-channel TFT 43 of the CMOS inverter circuit 40 have source electrodes 39 and 47 and drain electrodes 38 and 45 disposed apart from each other on the interlayer insulating film 24. On the interlayer insulating film 24, a separation section 51 is formed between the source electrode 39 and the drain electrode 38, and a separation section (not shown) is also formed between the source electrode 47 and the drain electrode 45.

The first active layer 31 made of the oxide semiconductor is provided so as to cover the separation section 51, and a portion of the source electrode 39 and a portion of the drain electrode 38 adjacent to the separation section 51, from the side opposite to the interlayer insulating film 24. Similarly, the third active layer 33 made of the oxide semiconductor is provided so as to cover the separation section between the source electrode 47 and the drain electrode 45, and a portion of the source electrode 47 and a portion of the drain electrode 45 adjacent to this separation section, from the side opposite to the interlayer insulating film 24.

The third active layer 33 is disposed so as to be offset from the second active layer 32 in the direction in which the gate electrode 36 extends when viewed from the direction normal to the surface of the TFT substrate 11, and the second active layer 32 and the third active layer 33 do not overlap each other.

On the surface of the interlayer insulating film 24, a passivation film 25 is formed so as to cover the first active layer 31, the third active layer 33, the source electrodes 39, 46, and 47, and the drain electrodes 38 and 45. Furthermore, a planarizing film 27 is formed on the surface of the passivation film 25. On the surface of the planarizing film 27, pixel electrodes 26 made of a transparent conductive film such as ITO, for example, are formed. The pixel electrodes 26 are connected to the drain electrodes 38 of the pixel-driving TFTs 41 through contact holes 28 formed in the planarizing film 27 and the passivation film 25.

—Manufacturing Method—

When manufacturing the liquid crystal display device 1, first, as shown in FIG. 17, an a-Si film, for example, is formed by PCVD or the like to a thickness of approximately 50 nm, for example, on the surface of the base coat layer 22 formed on the glass substrate 21. Next, by excimer laser annealing, a polysilicon film is formed from the a-Si film. Next, by etching the polysilicon film, an island-shaped semiconductor layer 32 is formed in the non-display region 17.

Next, the gate insulating film 23 is formed so as to cover the semiconductor layer 32. The gate insulating film 23 is made of an SiO$_2$ film with a thickness of 50 nm to 100 nm, for example. Then, as necessary, an impurity is implanted in the entire semiconductor layer 32. Next, the gate electrodes 35 and 36 are made by patterning by photolithography or the like a conductive film deposited onto the surface of the gate insulating film 23 by sputtering, CVD, or the like into a prescribed shape. At this time, the gate electrode 36 of the p-channel TFT 42 is formed so as to extend in a line so as to be connected with the gate electrode 37 of the n-channel TFT 43.

Then, using the gate electrode 36 as a mask, impurity ions such as boron ions, for example, are implanted in the semiconductor layer 32, and activation is performed by adding heat, thus forming the second active layer 32.

Next, as shown in FIG. 18, the interlayer insulating film 24 is formed on the entire glass substrate 21 so as to cover the gate insulating film 23 and the gate electrodes 35 and 36. Next, contact holes 29 are formed in the interlayer insulating film 24 and the gate insulating film 23 over the second active layer 32. Then, by patterning the conductive film formed on the interlayer insulating film 24 by photolithography or the like, the source electrodes 39, 46, and 47 and the drain electrodes 38 and 45 are formed. In this manner, the source electrode 46 and the drain electrode 45 are respectively connected to the second active layer 32 through the contact holes 29.

Next, an oxide semiconductor film is formed by sputtering to a thickness of approximately 30 nm to 100 nm, for example, so as to directly cover the source electrodes 39, 46, and 47 and the drain electrodes 38 and 45. Next, by etching the oxide semiconductor film by using photolithography and a resist mask, as shown in FIG. 18, the island-shaped first active layer 31 and third active layer 33 respectively covering the separation section 51 or the separation section between the source electrode 47 and the drain electrode 45 are formed.

Next, the passivation film 25 is formed so as to cover the first active layer 31 and the third active layer 33, and next, a planarizing film 27 is formed on the surface of the passivation film 25. Then, a contact hole 28 is formed in the passivation film 25 and the planarizing film 27 over the drain electrode 38 in the pixel-driving TFT 41. Next, the pixel electrodes 26 are formed by patterning by photolithography a transparent conductive film such as ITO deposited on the surface of the planarizing film 27 into a prescribed shape. In this manner, the TFT substrate 11 is manufactured.

—Effects of Embodiment 3—

Therefore, according to Embodiment 3 also, as in Embodiment 1, the first active layer 31 is made of an oxide semiconductor such as IGZO, and thus, the off leakage current in the pixel-driving TFTs 41 can be greatly reduced, and the aperture ratio can be greatly increased. Also, the driver circuit TFT (n-channel TFT) 42 has the second active layer 32 made of low temperature polysilicon, and thus, it is possible to perform high-speed driving while lowering the threshold voltage. Thus, the CMOS inverter circuit 40, which is a peripheral circuit, and pixel-driving TFTs 41 are formed integrally on the glass substrate 21, and it is possible to greatly reduce off leakage current in the pixel-driving TFTs 41 while improving the reliability of the driver circuit TFTs 42.

Furthermore, respective portions of the source electrode 39 and the drain electrode 38 of the pixel-driving TFT 41 are covered by the first active layer 31 from the side thereof opposite to the interlayer insulating film 24 on which the source electrode 39 and the drain electrode 38 are disposed, and respective portions of the source electrode 47 and the drain electrode 45 of the n-channel TFT 43 of the CMOS inverter circuit 40 are covered by the third active layer 33 from the side thereof opposite to the interlayer insulating film 24. Thus, there is no need to form etching stopper layers respectively on the first active layer 31 and on the third active layer 33. Thus, it is possible to prevent damage to the first active layer 31 and the third active layer 33 resulting from etching when forming the source electrodes 39, 47, and the like, and improve electrical characteristics of the pixel-driving TFTs 41 and the n-channel TFT 43, while reducing the number of masks needed during manufacturing and thereby reducing manufacturing costs.

Additionally, in the n-channel TFT 43 included in the CMOS inverter circuit 40, the third active layer 33 is made of the oxide semiconductor, and thus, compared to a conventional configuration in which the active layer is made of an LDD structure low temperature polysilicon, it is possible to have higher speed operation while reducing the number of manufacturing steps for the CMOS inverter circuit 40.

<<Other Embodiments>>

In Embodiments 1 to 3, a display device having a CMOS inverter circuit 40 was described, but the present invention is not limited thereto, and can be applied similar to a display device having another type of CMOS circuit having a NAND circuit, an AND circuit, a NOR circuit, an OR circuit, a shift register circuit, a sampling circuit, a D/A converter circuit, an A/D converter circuit, a latch circuit, a buffer circuit, or the like, for example.

Examples of other types of oxide semiconductors include $InGaO_3(ZnO)_5$, $MgxZn_{1-x}O$ (magnesium zinc oxide), $CdZn_{1-x}O$ (cadmium zinc oxide), CdO (cadmium oxide), a-IGZO (an In—Ga—Zn—O type amorphous oxide semiconductor), or the like. Also, it is possible to use amorphous ZnO, polycrystalline ZnO, or microcrystalline ZnO, which is a mixture of amorphous and polycrystalline, to which one or more types of impurity elements among group 1 elements, group 13 elements, group 14 elements, group 15 elements, and group 17 elements are added, or to which no impurity elements are added.

The non-oxide semiconductor may be another semiconductor of silicon or the like besides low temperature polysilicon.

In Embodiments 1 to 3, the present invention was described for a liquid crystal display device, but the present invention can be applied similarly to another display device such as an organic EL display device, for example.

The present invention is not limited to Embodiments 1 to 3 described above, and any appropriate combination of these Embodiments 1 to 3 are also included in the present invention.

INDUSTRIAL APPLICABILITY

As described above, the present invention is useful as a display device that includes thin film transistors having an oxide semiconductor layer, and a manufacturing method therefor.

DESCRIPTION OF REFERENCE CHARACTERS 1 liquid crystal display device
11 TFT substrate (circuit substrate)
16 display region
17 non-display region
21 glass substrate
31 first active layer
32 second active layer, semiconductor layer
33 third active layer
35, 36, 37 gate electrode
38, 45 drain electrode
39, 46, 47 source electrode
40 CMOS inverter circuit
41 pixel-driving TFT
42 p-channel TFT (driver circuit TFT)
43 n-channel TFT
45 drain electrode
51, 53 separation section

The invention claimed is:
1. A display device, comprising:
a circuit substrate including:
a display region including a plurality of pixels; and
a non-display region outside a periphery of the display region;
pixel-driving thin film transistors that drive the pixels, each of the pixel-driving thin film transistors located in the display region of the circuit substrate and including:
a first gate electrode provided on a gate insulating film;
a first source electrode;
a first drain electrode located apart from the first source electrode provided on an interlayer insulating film; and
a first active layer made of an oxide semiconductor;
a base coat layer provided on the circuit substrate;
a driver circuit thin film transistor located in the non-display region of the circuit substrate and including:
a second gate electrode provided on the gate insulating film;
a second drain electrode provided on the interlayer insulating film; and
a second active layer made of a non-oxide semiconductor; and
an n-channel thin film transistor including:
a third active layer made of the same oxide semiconductor as the first active layer;
a third gate electrode provided on the gate insulating film; and
a third drain electrode provided on the interlayer insulating film; wherein
the first active layer and the third active layer are provided on the interlayer insulating film;
the second active layer is provided on the base coat layer;
the interlayer insulating film is provided over the first gate electrode and the second gate electrode; and
the third drain electrode is connected to the second active layer.
2. The display device according to claim 1,
wherein the driver circuit thin film transistor is a p-channel thin film transistor;
wherein a CMOS circuit includes the driver circuit thin film transistor and the n-channel thin film transistor; and
wherein the CMOS circuit is located in the non-display region of the circuit substrate.
3. The display device according to claim 2,
wherein the second active layer of the p-channel thin film transistor and the third active layer of the n-channel thin film transistor in the CMOS circuit do not overlap each other when viewed from a direction normal to a surface of the circuit substrate.
4. The display device according to claim 3,
wherein the second gate electrode of the p-channel thin film transistor extends in parallel with the third gate electrode of the n-channel thin film transistor.
5. The display device according to claim 3,
wherein the second gate electrode of the p-channel thin film transistor is connected to the third gate electrode of the n-channel thin film transistor and extends in a line shape.
6. The display device according to claim 2,
wherein the second active layer of the p-channel thin film transistor and the third active layer of the n-channel thin film transistor in the CMOS circuit overlap each other when viewed from a direction normal to a surface of the circuit substrate, and
wherein the p-channel thin film transistor and the n-channel thin film transistor include a common gate electrode.
7. The display device according to claim 1, wherein the oxide semiconductor is an In—Ga—Zn—O-type oxide semiconductor.
8. The display device according to claim 2, wherein the circuit substrate includes a transparent insulating substrate on which the driver circuit thin film transistor, the pixel-driving thin film transistors, and the n-channel thin film transistor are located;

the second active layer of the p-channel thin film transistor is located on a side of the second gate electrode of the driver circuit thin film transistor closest to the transparent insulating substrate; and the first active layer and the third active layer of the n-channel thin film transistor are located on a side of the first gate electrodes of the pixel-driving thin film transistors and the third gate electrode of the n-channel thin film transistor opposite to the transparent insulating substrate.

9. The display device according to claim 6, wherein the circuit substrate includes a transparent insulating substrate on which the driver circuit thin film transistor, the pixel-driving thin film transistors, and the n-channel thin film transistor are located;

the second active layer of the p-channel thin film transistor is located on a side of the second gate electrode of the driver circuit thin film transistor closest to the transparent insulating substrate;

the first active layers are located on a side of the first gate electrodes of the pixel-driving thin film transistors opposite to the transparent insulating substrate; and the third active layer of the n-channel thin film transistor is located on a side of the third gate electrode of the n-channel thin film transistor opposite to the transparent insulating substrate.

10. The display device according to claim 1, wherein
the first active layer covers a portion of the first source electrode and a portion of the first drain electrode on a side opposite to the interlayer insulating film.

11. The display device according to claim 1, wherein
the second drain electrode and the third drain electrode are directly connected to one another.

12. The display device according to claim 1, wherein
the third drain electrode is connected to the second active layer through a contact hole formed in the interlayer insulating film and the gate insulating film.

13. The display device according to claim 1, wherein
the display device is an organic EL display device.

14. The display device according to claim 1, wherein the base coat layer is an insulating layer.

15. The display device according to claim 1, wherein the base coat layer is an insulating layer that is separated from the interlayer insulating film by the gate insulating film.

* * * * *